(12) United States Patent
Ueda et al.

(10) Patent No.: US 7,051,431 B2
(45) Date of Patent: May 30, 2006

(54) COMPONENT MOUNTING CONTROL METHOD

(75) Inventors: Yoichiro Ueda, Osaka (JP); Masaru Ichihara, Ashiya (JP); Daisuke Sato, Kadoma (JP); Ken Takano, Takaishi (JP)

(73) Assignee: Matsushita Electric Industrial Co., LTD, (JP)

( * ) Notice: Subject to any disclaimer, the term of this patent is extended or adjusted under 35 U.S.C. 154(b) by 451 days.

(21) Appl. No.: 10/412,675

(22) Filed: Apr. 14, 2003

(65) Prior Publication Data

US 2004/0049758 A1   Mar. 11, 2004

(30) Foreign Application Priority Data

Apr. 12, 2002 (JP) .............................. 2002-110164

(51) Int. Cl.
*H05K 3/30* (2006.01)
(52) U.S. Cl. ............................ 29/832; 29/825; 29/833; 29/840; 29/841
(58) Field of Classification Search ................. 29/825, 29/832, 833, 843, 841
See application file for complete search history.

(56) References Cited

U.S. PATENT DOCUMENTS 4,806,922 A * 2/1989 McLaughlin et al. ......... 349/73
5,714,252 A * 2/1998 Hogerton et al. ............ 428/344
6,926,796 B1 * 8/2005 Nishida et al. .............. 156/312

FOREIGN PATENT DOCUMENTS

JP          08-292018          11/1996

* cited by examiner

*Primary Examiner*—Carl J. Arbes
(74) *Attorney, Agent, or Firm*—Steptoe & Johnson LLP

(57) ABSTRACT

In a mounting system where a chip component is mounted by a small component mounting apparatus on paste solder applied onto a board and the mounting state is inspected by a mounting inspection apparatus, and when the mounting inspection apparatus confirms that a chip component is not present, it is firstly confirmed whether or not a mounting trace of a chip component is present on solder, and a mounting nozzle is specified which has mounted a chip component found to be a missing component according to the confirmation result. Thereafter, the confirmation result is transmitted to a controller of the small component mounting apparatus. The controller selects and obtains coping information from a data base based on the confirmation result, and the information is shown on a display.

9 Claims, 11 Drawing Sheets

COMPONENT MOUNTING CONTROL METHOD

FIELD OF THE INVENTION

The present invention relates to a technique of mounting electronic components.

BACKGROUND OF THE INVENTION

A method has been conventionally available in which paste solder is applied onto a printed circuit board (hereinafter, referred to as a "board") by using a printing technique, electronic components are mounted on the applied solder, and then, reflowing (heating and cooling) is performed to fix the electronic components on the board.

Since a number of electronic components are usually mounted on a board, on a line for mounting electronic components by using solder, after the electronic components are mounted, the state of mounting the electronic components (that is, whether or not the electronic components are mounted on predetermined positions) is inspected before reflowing.

Incidentally, since confirmation is made only for the position of a mounted electronic component and the presence or absence of the electronic component, when the absence of electronic component is confirmed, it is not possible to recognize whether or not the electronic component is actually conveyed onto solder. Therefore, regarding an error indicative of the absence of an electronic component, an operator has to take time to adjust apparatuses while assuming various causes. This operation is one of the causes of lower productivity.

DISCLOSURE OF THE INVENTION

The present invention is devised in view of the above problem and has a main object to achieve a prompt operation performed by an operator to cope with a mounting error which confirms the absence of an electronic component.

A component mounting control method for controlling mounting of an electronic component according to the present invention comprises confirming whether or not an electronic component is present on an adhesive material applied onto a predetermined position on a board, confirming whether or not a trace of mounting failure of an electronic component is present on the adhesive material when it is confirmed that no electronic component is present on the adhesive material, and communicating the confirmed presence or absence of a trace of mounting failure to a controller for controlling an operation of a mounting unit for mounting an electronic component on a predetermined position.

Further, the method comprises specifying a mounting unit that has performed a mounting operation when no electronic component is confirmed to be present on the adhesive material, and communicating information that has specified the mounting unit to the controller during communicating the presence or absence of a trace of mounting failure to the controller.

Further, the method comprises confirming a holding operation of an electronic component by the mounting unit, and selecting information from a group of information group previously prepared according to the confirmed holding operation of an electronic component and the confirmed presence or absence of a trace of mounting failure.

Further, the method comprises, upon confirming the holding operation of an electronic component by the mounting unit, confirming whether or not the mounting unit is erroneously recognized as holding an electronic component when the mounting unit holds no electronic component.

Further, the method comprises, when it is confirmed that no electronic component is present on the adhesive material, calling a recognition result obtained when an electronic component was held by the mounting unit, and selecting information from a group of information previously prepared according to the recognition result.

Further, the method comprises, when a trace of mounting failure is confirmed to be present on the adhesive material, selecting information from a group of information previously prepared according to at least one of a holding rate and an average deviation of a holding position of the electronic component held by the mounting unit.

Further, the method comprises outputting information obtained by selecting information.

Further, the method comprises performing maintenance according to the information obtained by selecting information.

Still further, the method comprises, in confirming a trace of mounting failure on the adhesive material, specifying an electrode-exposed area in an area where an electronic component should be present, and confirming the presence or absence of the trace using an area size of the electrode-exposed area.

DESCRIPTION OF THE EMBODIMENT

Figure 1:
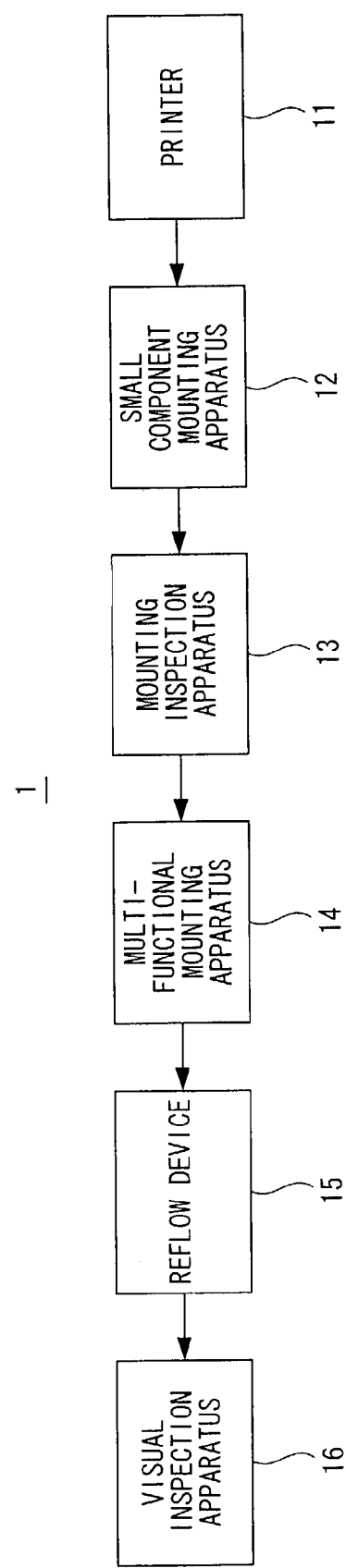
FIG. 1 is a diagram showing a configuration of a mounting system.

FIG. 1 is a diagram showing the configuration of a mounting system 1 according to one embodiment of the present invention. In the mounting system 1, a printer 11, a small component mounting apparatus 12, a mounting inspection apparatus 13, a multi-functional mounting apparatus 14, a reflow device 15, and a visual inspection apparatus 16 are arranged in this order.

The printer 11 applies paste solder onto a printed circuit board by printing, and the small component mounting apparatus 12 mounts small electronic components to the solder on the board. The mounting inspection apparatus 13 inspects the mounting state of the small electronic components and also inspects the applying state of solder where electronic components are mounted by the multi-functional mounting apparatus 14 for connection, so that mounting of the electronic components can be controlled. The multifunctional mounting apparatus 14 mounts relatively large electronic components such as a chip size package (CSP) and a quad flat package (QFP) and electronic components having complicated shapes.

The reflow device 15 fixes the electronic components by heating and cooling the board with a predetermined temperature profile, the board having all the electronic components mounted on the solder, and the visual inspection apparatus 16 inspects the appearance of the board after mounting.

Figure 2:
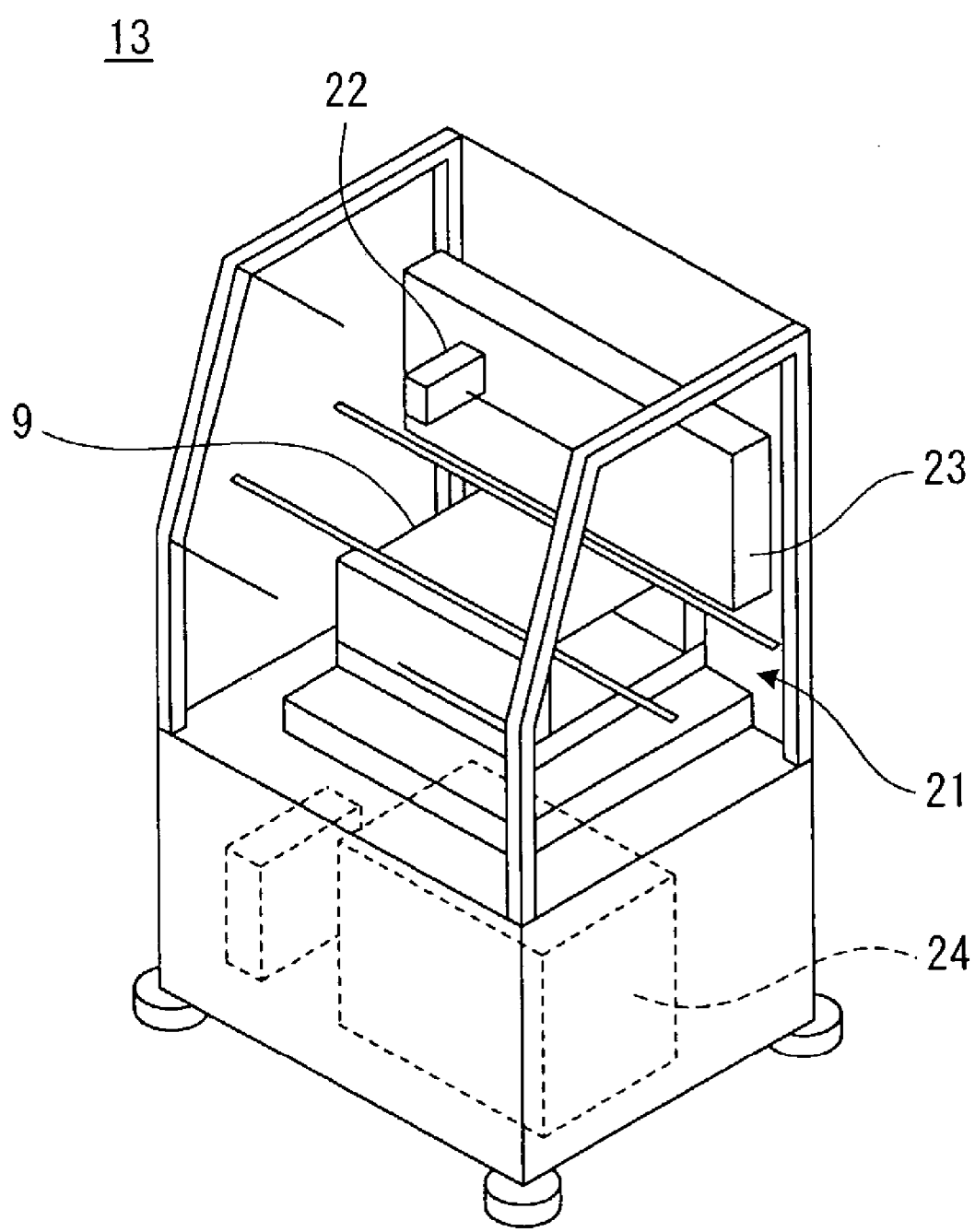
FIG. 2 shows an appearance of a mounting inspection apparatus.

FIG. 2 is a diagram showing the appearance of the mounting inspection apparatus 13. The mounting inspection apparatus 13 has a transporting mechanism 21 constituted by a guide and a belt for transporting a board 9, and a color line sensor 22 for imaging the transported board 9 is arranged for information of the transporting mechanism 21. The color line sensor 22 is moved at a constant speed by the driving mechanism 23 along the transporting direction of the board 9. As to a image pickup sensor, a 3D sensor or an area sensor may be taken into consideration. Further, in the lower apparatus base, a controller 24 is placed which has a control circuit and the like for controlling a mechanical operation of the mounting inspection apparatus 13, an image processor for processing images retrieved by the color line sensor 22, and so on.

Figure 3:
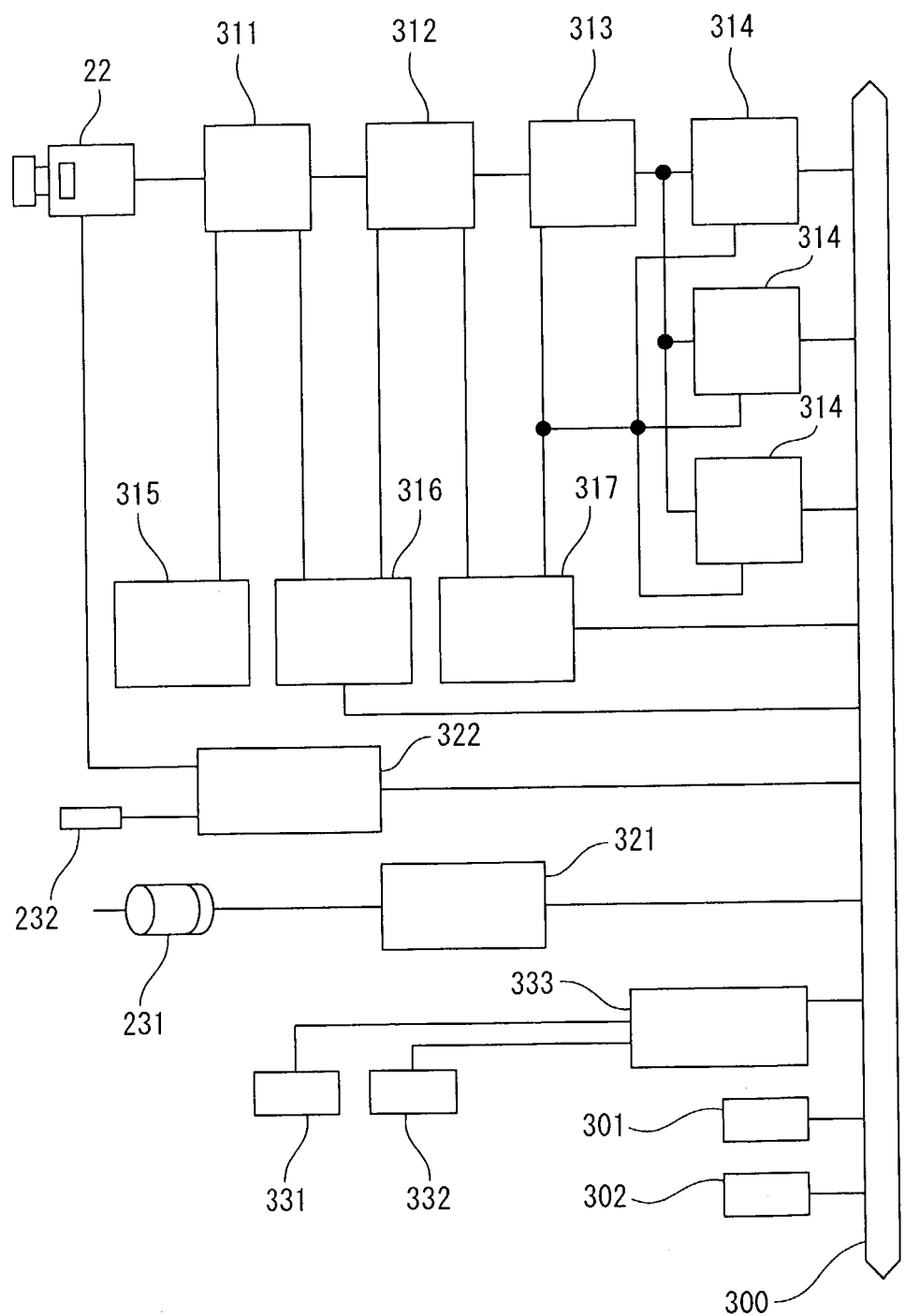
FIG. 3 is a block diagram showing a configuration of image processing within a controller together with a peripheral configuration.

FIG. 3 is a block diagram showing the configuration for image processing in the controller 24 together with the peripheral configuration. The controller 24 has a CPU 301 for controlling the whole apparatus and a memory 302. The CPU 301 transmits and receives signals to and from the other configurations via a bus line 300.

The output from the color line sensor 22 is stored as image data in a taken-in memory 311, and a specific area of the image is segmented and stored in a segmentation memory 312. Then, the segmented area is processed by an image processing circuit 313 and is further processed by various inspection circuits 314, so that inspection results can be obtained.

A signal from a memory address generating circuit 315 is inputted to the taken-in memory 311 to control the timing of taking an image. Moreover, a part of image data in the taken-in memory 311 is segmented and transferred to the segmentation memory 312 in response to a signal from a segmentation memory address generating circuit 316. A signal from the image processing timing generating circuit 317 is inputted to the segmentation memory 312, the image processing circuit 313, and the inspection circuits 314 to synchronize the timings of image processing and inspection. Besides, the above-described various circuits are provided as boards for inspection on the controller 24, and the inspection results are stored in the memory 302 via the bus line 300.

A motor control circuit 321 and a linear scale counting circuit 322 are further connected to the bus line 300. The motor control circuit 312 controls a motor 231 of a driving mechanism 23 for moving the color line sensor 22 and the linear scale counting circuit 322 receives a signal from a linear scale 232 for detecting the position of the color line sensor 22. With this configuration, under the control of the CPU 301, the color line sensor 22 is moved at a constant speed relative to the board 9. Further, the output from the linear scale counting circuit 322 is inputted to the taken-in memory address generating circuit 315 and two-dimensional color image data can be properly obtained by the color line sensor 22. Here, instead of the color line sensor 22 and the driving mechanism 23, a camera for two-dimensional image pickup or a sensor using a three-dimensional method (sensor for detecting height information) may be provided.

An output device 331 such as a display and a speaker for outputting various kinds of information to an operator and an input device 332 such as a button, a mouse, and a touch panel for receiving an input of an operator are connected to the bus line 300 via a man-machine interface 333.

Figure 4:
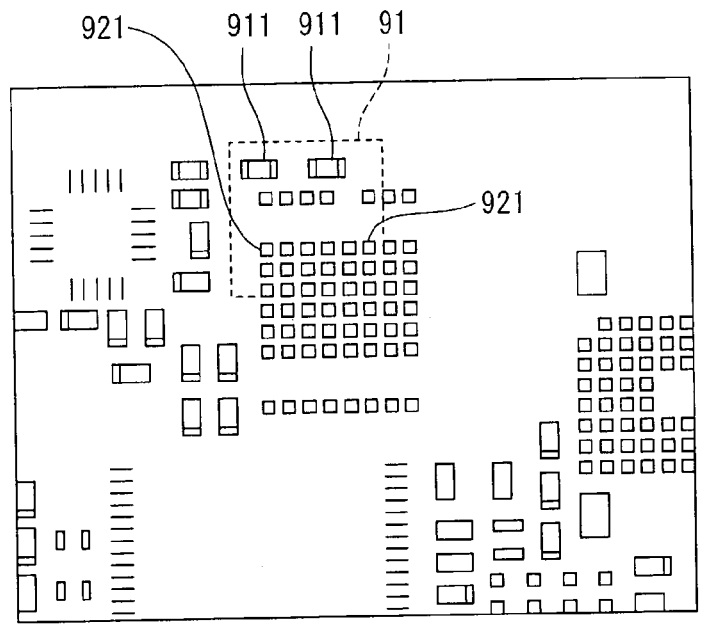
FIG. 4 is a diagram for exemplifying a part of an image obtained by a color line sensor.

Next, the following will discuss the contents of an inspection performed by the mounting inspection apparatus 13. FIG. 4 is a diagram showing a part of an image obtained by the color line sensor 22 and an area 91 represents an area stored in the segmentation memory 312. In the area 91, small electronic components (hereinafter, referred to as "(small) chip components") 911 have been already mounted by the small component mounting apparatus 12, and solder 921 is applied to an area where large electric components are scheduled to be mounted by the multi-functional mounting apparatus 14. The mounting inspection apparatus 13 inspects whether the small chip components 911 are properly mounted or not and inspects whether the solder 921 is properly applied or not before the large electronic components are mounted. The inspection is performed before the large electronic components are mounted. This is because a number of large electronic components conceal the solder 921 under the components after being mounted.

Figure 5A:
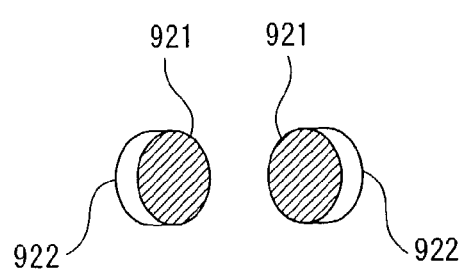
FIGS. 5A to 5D are diagrams for exemplifying patterns of a mounting error regarding a small chip component.
Figure 5B:
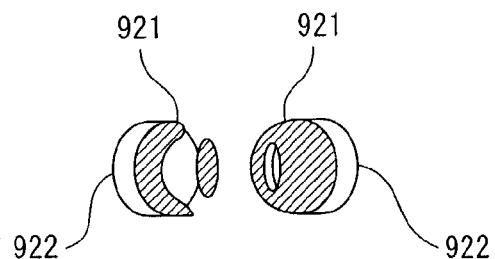
Figure 5C:
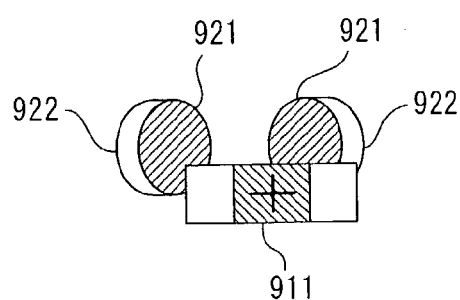
Figure 5D:
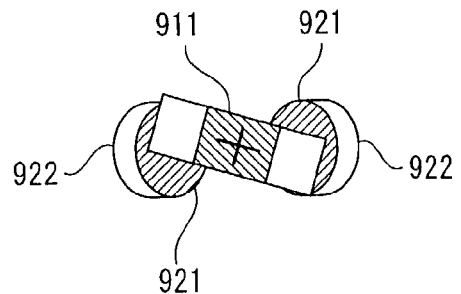

FIGS. 5A to 5D are diagrams for exemplifying the patterns of a mounting error of the small chip component 911. FIG. 5A shows a state in which the chip component 911 is not present on an electrode 922 and no trace of the chip component 911 making contact with the solder 921 is not found. FIG. 5B shows a state in which the chip component 911 is not present on the electrode 922 but a trace of the chip component 911 mounted on the solder 921 is left. That is, if the mounting of the chip component 911 fails and a mounting nozzle sucking the chip component 911 carries it away without releasing it, or the mounting nozzle press-pushes the chip component 911 so hard against the board 9 that the chip component 911 is flicked away, the solder on the electrode 922 is partly pulled off and chipped off, or partly pulled away to lose its original shape, thus leaving a trace of such mounting failure. From the shape of the mounting failure trace left in the solder (hereinafter, referred to as "mounting trace"), one of the mounting failure modes can be identified. On the other hand, FIG. 5C shows a state in which the chip component 911 is mounted but is mounted on a position displaced from the solder 921, and FIG. 5D shows a state in which the center of the chip component 911 exists at a proper position but the chip component 911 is rotated and is mounted while being displaced from the solder 921.

Figure 6A:
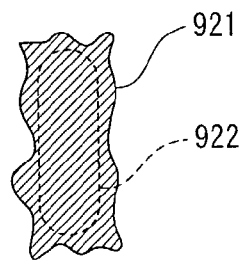
FIGS. 6A to 6D are diagrams for exemplifying patterns of an applying error regarding solder applied to a large electronic component.
Figure 6B:
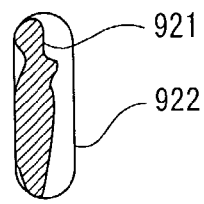
Figure 6C:
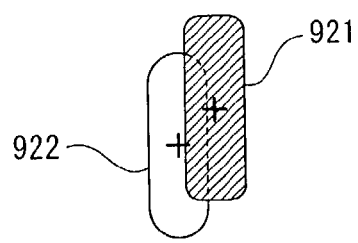
Figure 6D:
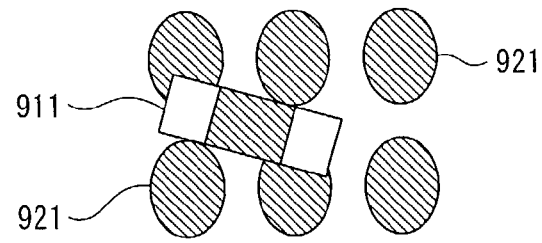

FIGS. 6A to 6D are diagrams for exemplifying the patterns of an applying error of the solder 921 which is applied for large electronic components. FIG. 6A shows a state in which the solder 921 applied onto the electrode 922 spreads, and FIG. 6B shows a state in which the solder 921 fades and an amount of application becomes insufficient. FIG. 6C shows a state in which the solder 921 is applied while being displaced from the electrode 922. FIG. 6D shows a state in which the small chip component 911 is flicked or dropped by a nozzle when being mounted and the small chip component 911 is positioned on a number of solders 921 applied for CSP and so on.

The above various errors are caused by extracting an area having a color of the board 9, a color of the solder 921, and a color of the chip component 911 from an area segmented from an obtained image. Moreover, the mounting position of the chip component 911 and the application area of the solder 921 have been prepared on the mounting inspection apparatus 13 in advance, and areas including inspection targets are processed in order by the inspection circuits 314. As described above, the mounting inspection apparatus 13 performs various inspections on mounting of the small chip component 911 and the applying state of the solder for large electronic components. The inspections for the small component mounting apparatus 12 and the multi-functional mounting apparatus 14 are performed by one apparatus.

Next, after the description of the mounting trace detected by the mounting inspection apparatus 13, the following will discuss an inspecting operation for an error indicating the small chip component 911 not being mounted.

Figure 7A:
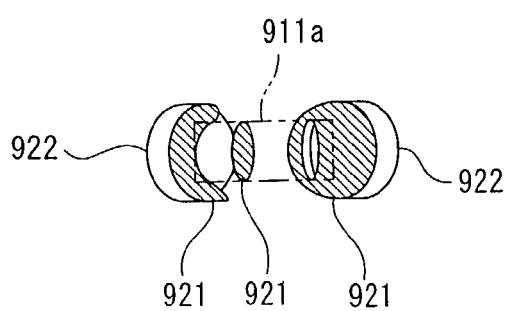
FIGS. 7A and 7B are diagrams for exemplifying a trace of mounting failure.
Figure 7B:
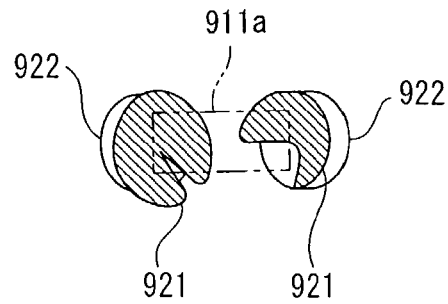

FIGS. 7A and 7B are diagrams exemplifying the mounting trace. The mounting trace includes the case where an adhesion area of the solder 921 is divided into two or more areas just like the solder 921 on the electrode 922 on the left side of FIG. 7A, the case where a part of the electrode 922 is exposed in an adhesion area of the solder 921 just like the solder 921 on the electrode 922 on the right side of FIG. 7A, and the case where the edge of an adhesion area of the solder 921 largely spread inward just like the solders 921 on both of the electrodes 922 shown in FIG. 7B. All the mounting traces are similar in that the solder 921 is partially exfoliated from the electrode 922 in an area 911a where the chip component 911 has to be mounted.

Figure 8:
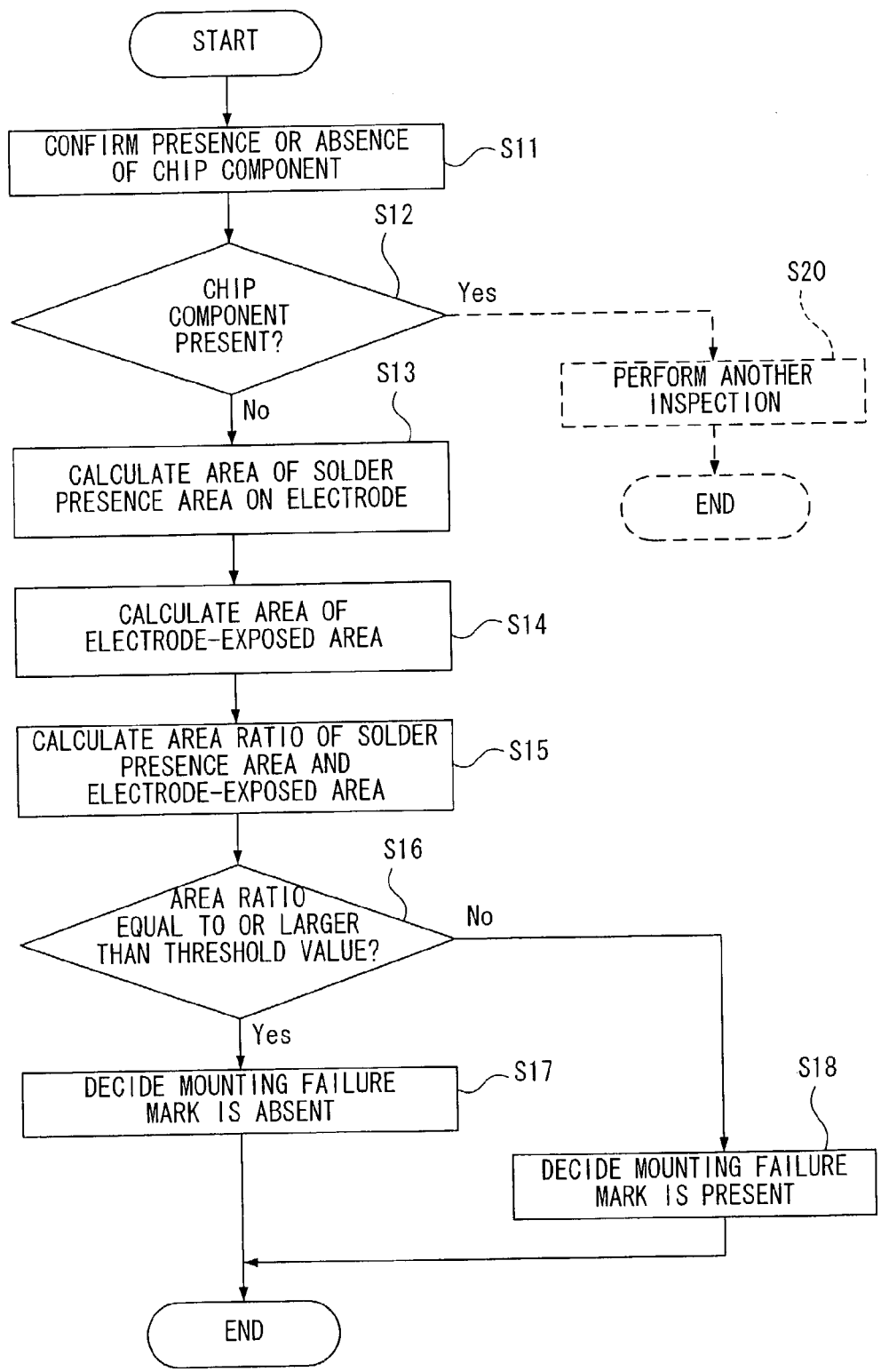
FIG. 8 shows a flow of operations performed by the mounting inspection apparatus.

FIG. 8 is a diagram showing a flow of operations of the mounting inspection apparatus 13 and focuses attention on operations performed when the chip component 911 is not mounted. Here, FIG. 8 shows operations after an inspection area on the board 9 is specified so as to correspond to one chip component 911. The operations of FIG. 8 are repeated on a plurality of inspection areas.

The mounting inspection apparatus 13 firstly confirms whether the chip component 911 is present or not in an inspection area (step S11). The presence of the chip component 911 is confirmed based on whether the color of the chip component 911 is present or not or whether the edge of the chip component 911 is extracted or not by using edge extraction.

When the chip component 911 is present, other inspections are performed for confirming the displaced position of the chip component 911 and whether the posture is acceptable or not (steps S12, S20). On the other hand, when the absence of the hip component 911 is confirmed, it is confirmed whether the mounting trace of the chip component 911 is present or not (steps S12 to S18). As described above, the mounting trace is a mark of the chip component 911 mounted on the paste solder 921. The occurrence of the mounting trace includes the case where the mounting nozzle of the small component mounting apparatus 12 brings back the chip component 911 without releasing the chip component 911 after mounting and the case where the mounting nozzle strongly presses the chip component 911 onto the board 9 and flicks the chip component 911 during mounting.

When the mounting trace is detected, the area 911a (FIGS. 7A and 7B), on which the chip component 911 has to be mounted, is firstly specified in an inspection area. Then, based on data indicating an area of the electrode 922 which has been previously prepared for inspection, an area having the solder 921 on the electrode 922 (hereinafter, referred to as a "solder presence area") is calculated (step S13). The solder presence area is specified by extracting an area according to a color of the solder.

Next, on the area 911a where the chip component 911 has to be mounted, an area size of an area having the exposed electrode 922 (hereinafter, referred to as an "electrode-exposed area") is calculated (step S14). The electrode-exposed area is also specified by extracting an area according to a color of the predetermined electrode. When the solder presence area and the electrode-exposed area are specified, a ratio of these areas is calculated (step S15). When an area ratio is equal to or larger than a predetermined threshold value, that is, when the electrode-exposed area is sufficiently small, it is decided that the mounting trace of the chip component 911 is not present on the electrode 922. When an area ratio is lower than the predetermined threshold value, that is, when the electrode-exposed area is large, it is decided that a mounting trace is present on the electrode 922 (steps S16 to S18).

In the above operation for confirming a mounting trace, an area size of the electrode-exposed area is used by focusing an attention on the following point that the solder 921 on the electrode 922 adheres to the chip component 911 and is carried away when the chip component 911 is mounted, or a mounting trace appears due to uneven application of the solder 921. A higher technique may be adopted for judging the presence or absence of a mounting trace.

For example, how large the adhesion of the solder 921 goes out of the application area may be taken into consideration. Thus, even when the solder 921 does not adhere to the chip component 911 or is not exfoliated, a mounting trace can be detected. Further, the following operation is also applicable: an area ratio is calculated two or more times in view of displacement in sucking of the chip component 911 while the area 911a is shifted, and when any of the area ratios is smaller than the threshold value, it is judged that a mounting trace is present.

Moreover, the operation for confirming a mounting trace is realized by causing the inspection circuits 314 to compare areas based on the processing results after the image processing circuit 313 extracts various areas. Some of these operations may be replaced with software processing using the CPU 301 and all the operations may be realized as software.

When inspections are completed on all the inspection areas for mounting on the board 9 and the inspection results include a mounting error, the operation is performed so as to correspond to the inspection result in the mounting system 1. The following will discuss an operation when a missing component error indicating that the small chip component 911 is not mounted is detected as an inspection result. Although FIG. 1 illustrates only one small component mounting apparatus 12, an explanation will be given on the assumption that a plurality of small component mounting apparatuses 12 are arranged in the mounting system 1.

Figure 9:
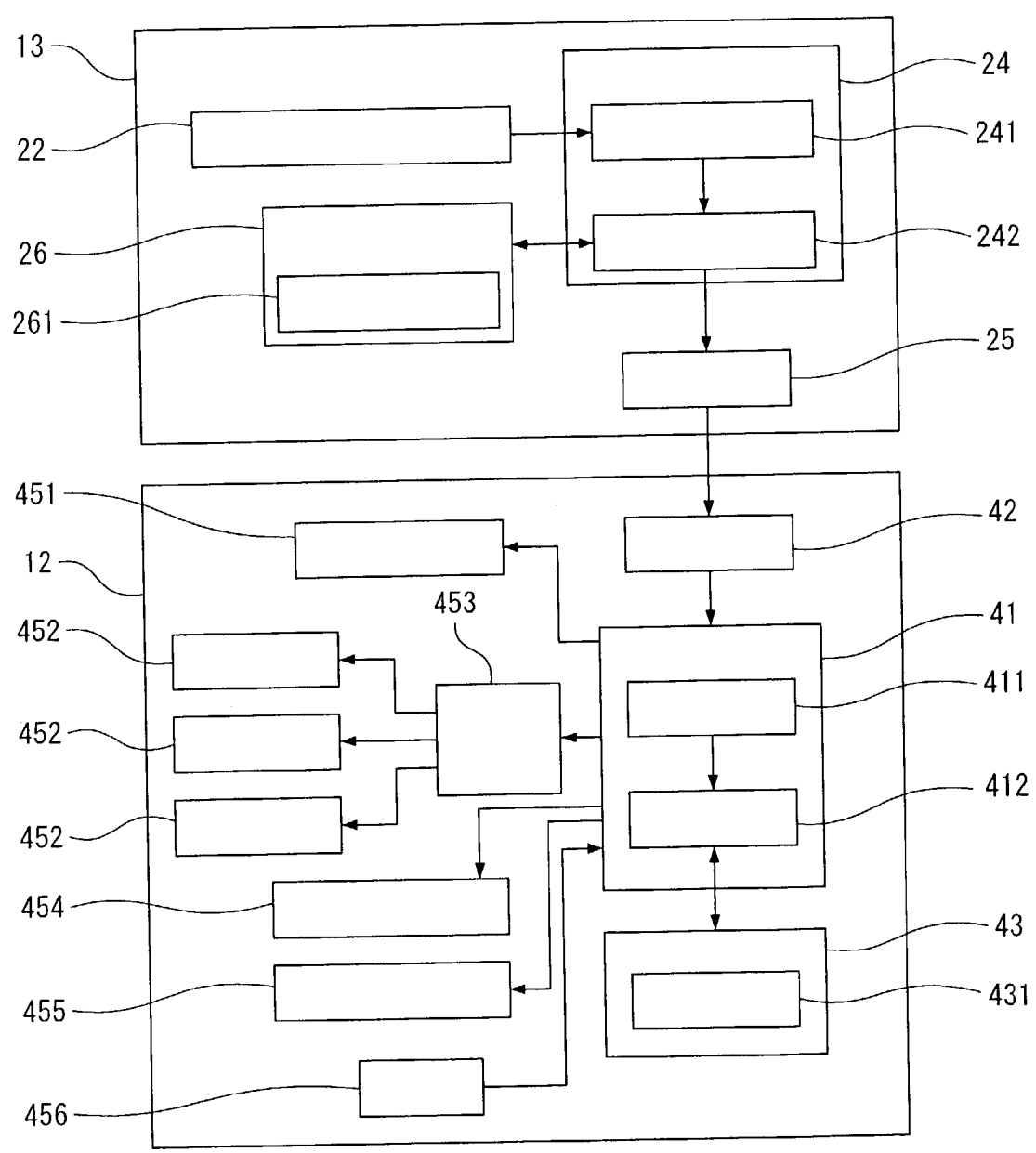
FIG. 9 is a block diagram showing a configuration concerning the operations of the mounting inspection apparatus and a small component mounting apparatus, performed when a missing component error occurs.

FIG. 9 is a block diagram showing the configuration concerning the operations of the mounting inspection apparatus 13 and the small component mounting apparatus 12 in the event of a missing component error. It is assumed that the controller 24 of the mounting inspection apparatus 13 and the controller 41 of the small component mounting apparatus 12 can transmit information via a transmitting circuit 25 and a receiving circuit 24. In the event of a missing component error, communication is performed between the mounting inspection apparatus 13 and the small component mounting apparatus 12.

The controller 24 of the mounting inspection apparatus 13 has an inspection board 241, which includes various circuits for performing the above-described inspections, and a fixed disk 26 for storing information, and the inspection board 241 is connected to the color line sensor 22. Further, as a software function performed by the CPU and so on, the controller 24 has a function of obtaining information from a data base (hereinafter, referred to as DB) 261 concerning the small component mounting apparatus 12 (illustrated as a nozzle specifying unit 242 in FIG. 9).

In order to perform an operation for inspection results, the controller 41 of the small component mounting apparatus 12 has a function of confirming that mounting nozzles 452 hold a component so as to correspond to a missing component error and a function of obtaining information from the DB 431 in the fixed disk 43 (illustrated as a holding confirming unit 411 and an information obtaining unit 412 in FIG. 9) as software functions performed by the CPU and so on. Moreover, a display 451 for displaying various kinds of information for an operator, a suction controller 453 for controlling a sucking operation of the mounting nozzles 452, a nozzle cleaning mechanism 454 for cleaning the mounting nozzles 452, a nozzle moving mechanism 455 for moving the mounting nozzles 452, a camera 456 for photographing the tip of the mounting nozzle 452, and so on are connected to the controller 41.

Figure 10:
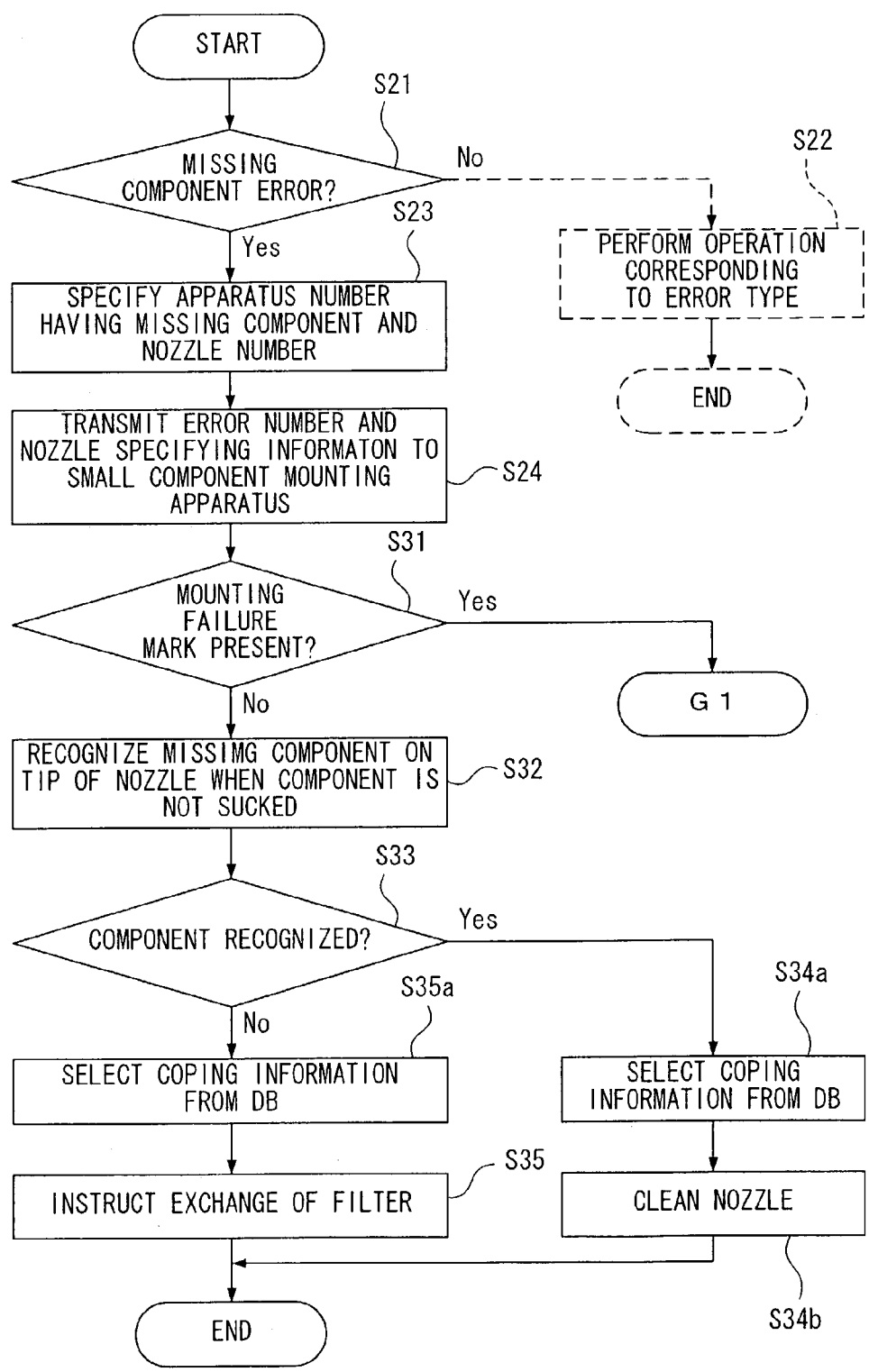
FIG. 10 shows a flow of operations of the mounting inspection apparatus and the small component mounting apparatus, performed when a missing component error occurs.
Figure 11:
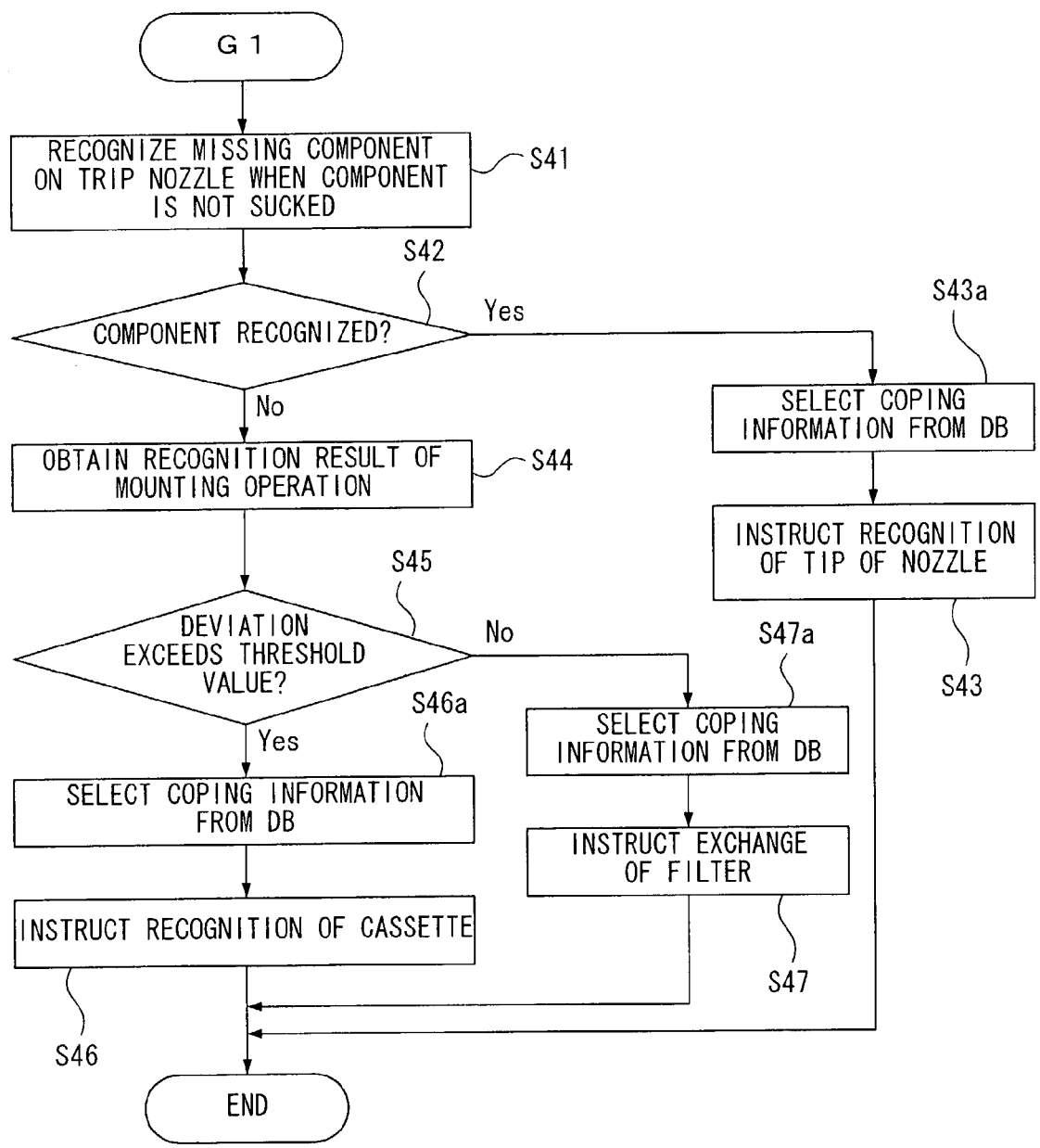
FIG. 11 shows a flow of operations of the mounting inspection apparatus and the small component mounting apparatus, performed when a missing component error occurs.

FIGS. 10 and 11 are diagrams showing the flows of the operations of the mounting inspection apparatus 13 and the small component mounting apparatus 12 in the event of a missing component error. The detail is omitted. In the event of a mounting error other than a missing component error, an operation is performed by the mounting system 1 according to the kind of errors (steps S21 and S22).

When a mounting error detected by the inspection board 241 is a missing component error, in the mounting inspection apparatus 13, the nozzle specifying unit 242 refers to a DB 261 serving as a information group in the fixed disk 26 and specifies which mounting nozzle 452 of which small component mounting apparatus 12 performs a mounting operation of a chip component which is found to be a missing component. Namely, an allocated number to the small component mounting apparatus 12 performing mounting and an allocated number to the mounting nozzle 452 are specified (step S23). Then, an error number indicating the kind of error is transmitted to the specified small component mounting apparatus 12 and information for specifying the mounting nozzle 452 is transmitted to the controller 41 from the transmitting circuit 25 (step S24) The error number includes information indicating the presence or absence of a mounting trace.

When the controller 41 of the small component mounting apparatus 12 receives information from the mounting inspection apparatus 13 via the receiving circuit 42, the controller 41 refers to the error number and confirms whether a missing component error having a mounting trace or a missing component error not having a mounting trace appears (step S31). When a mounting trace is not present, the holding confirming unit 411 of the controller 41 confirms an operation when the mounting nozzle 452 holds a chip component. To be specific, the holding confirming unit 411 firstly controls the nozzle moving mechanism 455 and moves the mounting nozzle 452 corresponding to a missing component error to the photographing position of the camera 456. At this point, the suction control section 453 is inactivated and the mounting nozzle 452 is moved in a state in which a chip component is not sucked and held. Then, the tip of the mounting nozzle 452 is photographed by the camera 456 and a chip component is recognized (step S32).

When the presence of a chip component is recognized in step S32, since the contamination on the tip of the mounting nozzle is erroneously recognized as a chip component, there is a high probability that a mounting operation is performed despite of the chip component not being sucked. Hence, in the small component mounting apparatus 12, the mounting nozzle is automatically cleaned by the nozzle cleaning mechanism 454 according to the controller 41 (steps S33 and S34).

Meanwhile, when the presence of a chip component is not recognized in step S32, there is a high probability that the mounting nozzle 452 decreases in suction due to contamination on a filter of a vacuum passage for suction and a chip component is dropped from the mounting nozzle 452 between the recognition and mounting of the chip component. Hence, the controller 41 provides display to notify an operator on the display 451 that a filter needs to be exchanged (steps S33 and S35).

The operations in step S34 and step S35 are performed by causing the information obtaining unit 412 of the controller 41 to select and obtain coping information from the DB 431, which is a coping information group having been prepared in advance, based on the error number and the recognition result of a component (steps S34a and S35a).

Also in the case where a missing component error having a mounting trace is confirmed in step S31, the holding confirming unit 411 of the controller 41 firstly controls the nozzle moving mechanism 455 and moves the mounting nozzle 452 corresponding to a missing component error to the photographing position of the camera 456 in a state in which the component is not sucked. The camera 456 photographs the tip of the mounting nozzle 452 and the chip component is recognized (FIG. 11: step S41).

When recognition is made that the chip component exists on the tip of the mounting nozzle 452, the chip component is fit into a suction port on the tip f the mounting nozzle 452 and is not removed. Or since there is a high probability that the chip component adheres to the tip of the mounting nozzle 452 due to adhesive dust and the like, the display 451 shows an instruction to confirm the tip of the mounting nozzle 452 based on coping information selected and obtained from the DB 431 by the information obtaining unit 412 (steps S42, S43a, and S43).

When recognition is made that a chip component is not present on the tip of the mounting nozzle 452, the information obtaining unit 412 of the controller 41 calls a component recognition result for confirming the sucking position from the DB 431 (steps S42 and S44). The component recognition result is obtained when the mounting nozzle 452 holds a chip component which is a missing component (that is, during a mounting operation in the past). Then, the controller 41 performs the following operations based on the recognition result.

First, the controller 41 confirms whether or not a deviation amount between the center position of the chip component included in the recognition result and the center position of the mounting nozzle 452 is larger than a predetermined threshold value (step S44).

When the deviation amount exceeds the threshold value, the mounting nozzle 452 performs suction while a chip component is largely displaced due to a problem of a cassette for permitting the mounting nozzle 452 to take the chip component, and there is a high possibility that the chip component is flicked away by the mounting nozzle 452 pressing the end of the chip component during mounting. Hence, the display 451 shows an instruction to confirm that any problem is not found on the position and the state of the cassette based on the coping information selected and obtained by the information obtaining unit 412 from the DB.431 (steps S45, S46a, and S46).

When the deviation amount is smaller than the threshold value, since there is a high probability that suction is not sufficiently released due to contamination on a filter of the vacuum passage and the mounting nozzle 452 brings back the chip component after the mounting operation, based on the coping information selected and obtained by the information obtaining unit 412 from the DB 431, the controller 41 provides display to notify an operator on the display 451 that the filter needs to be exchanged (steps S45, S47a, and S47).

As described above, since the mounting system 1 confirms the presence or absence of a mounting trace when a missing component error is detected by the mounting inspection apparatus 13, it is possible to more properly control mounting of electronic components. Further, in the small component mounting apparatus 12, chip components are automatically recognized for the mounting nozzles 452, and maintenance is automatically performed or a coping method is notified to an operator according to the confirmation results of an operation of recognizing components and the presence or absence of a mounting trace. Hence, a missing component error can be promptly handled.

Figure 12:
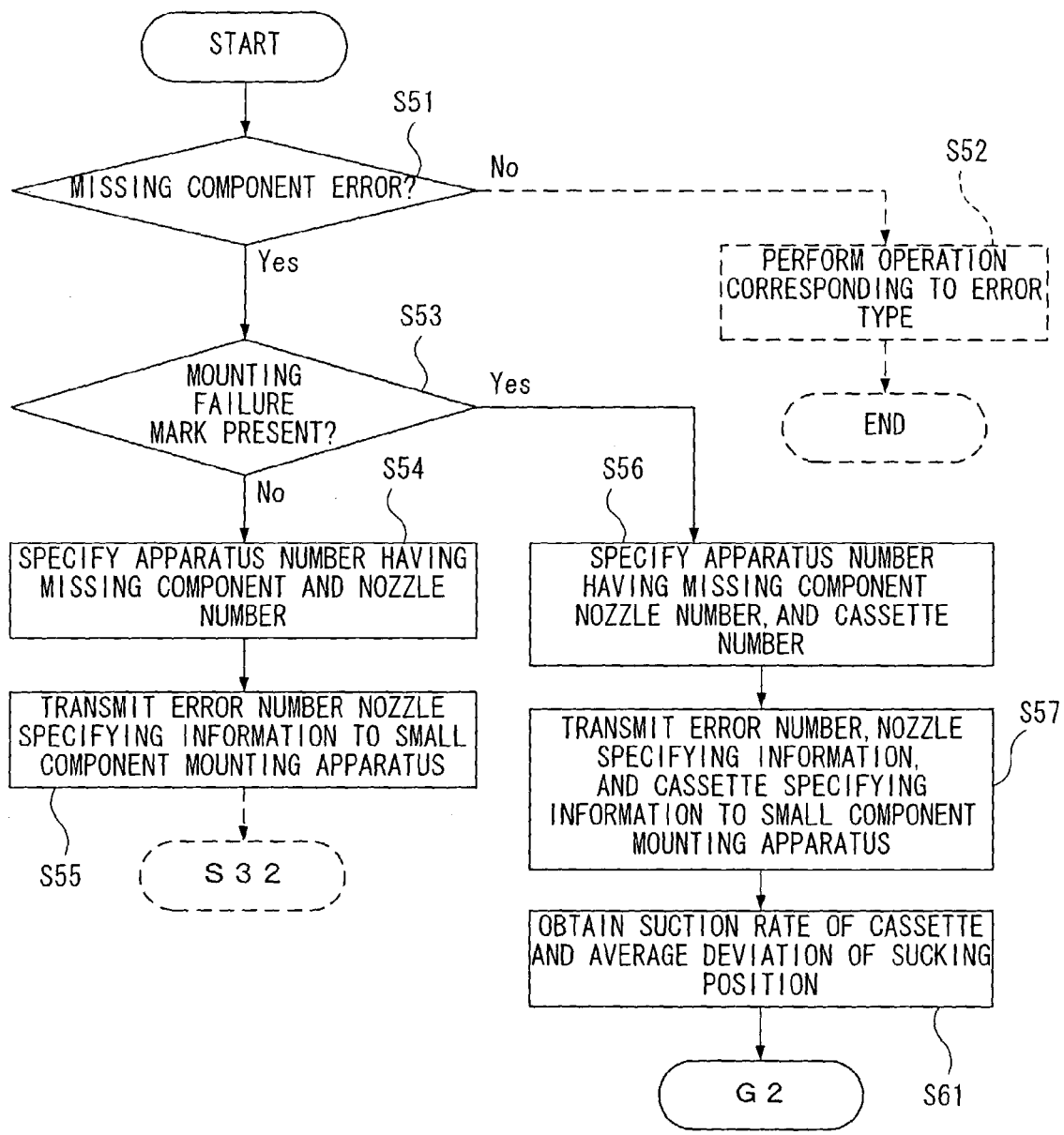
FIG. 12 is a diagram showing another operation example of the mounting inspection apparatus and the small component mounting apparatus.
Figure 13:
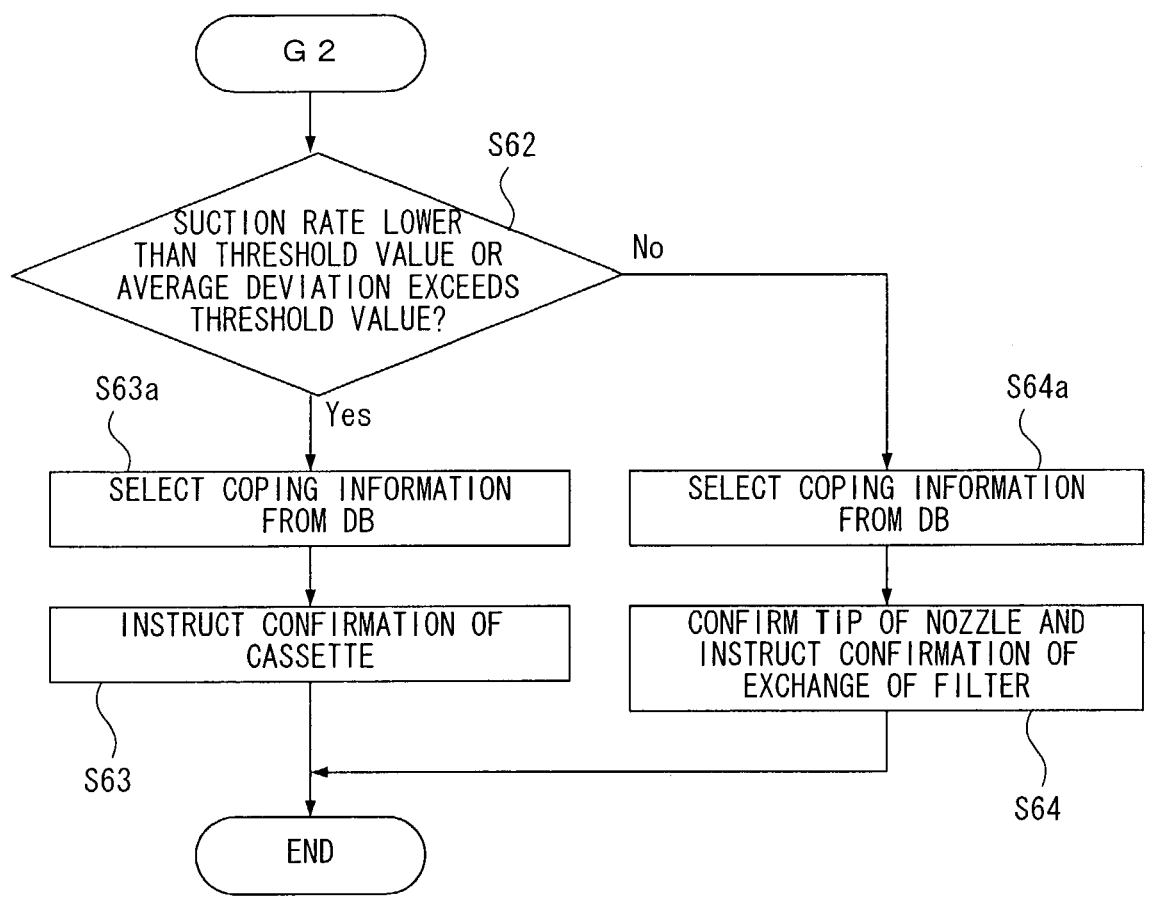
FIG. 13 is a diagram showing another operation example of the mounting inspection apparatus and the small component mounting apparatus.

FIGS. 12 and 13 are diagrams showing another operating example of the mounting inspection apparatus 13 and the small component mounting apparatus 12. In the operations of FIGS. 12 and 13, when the occurrence of a missing component error is confirmed, it is firstly confirmed whether a mounting trace is present or not (step S51 and S53). Except for a missing component error, an operation is performed for each kind of mounting errors (step S52).

When no mounting trace is present in a missing component error, in the mounting inspection apparatus 13, the allocated number to the small component mounting apparatus 12 which mounts a chip component found to be a missing component and the allocated number to the mounting nozzle 452 are specified by referring to the DB 261 (step S54), and the error number and information for specifying the mounting nozzle 452 are transmitted to the specified small component mounting apparatus 12 from the transmitting circuit 25 (step S55). Thereafter, coping operations similar to those after step S32 of FIG. 10 are performed by the small component mounting apparatus 12.

When a mounting trace is present, in addition to the allocated number to the small component mounting apparatus 12 which performs mounting by referring to the DB 261 and the allocated number to the mounting nozzle 452 in the mounting inspection apparatus 13, an allocated number to a cassette is also specified (step S56). The cassette supplies a chip component found to be a missing component to the mounting nozzle 452. Then, the error number, information for specifying the mounting nozzle 452, and information for specifying a cassette are transmitted to the corresponding small component mounting apparatus 12 (step S57).

When the controller 41 of the small component mounting apparatus 12 obtains various kinds of information via the receiving circuit 42, the information obtaining unit 412 of the controller 41 obtains a suction rate where the mounting nozzle 452 successfully sucks a chip component from a cassette corresponding to a missing component and an average deviation of the sucking position on the mounting nozzle 452 by referring to the DB 431 of the fixed disk 43 (step S61). In the controller 41, the suction rate and the average deviation are further compared with individual threshold values.

When the suction rate is lower than the threshold value or the average deviation exceeds the threshold value, there is a high probability that the mounting nozzle 452 sucks a chip component which is largely deviated due to a problem of a cassette and the chip component is flicked away by permitting the mounting nozzle 452 to press the end of the chip component during mounting. Hence, the display 451 shows an operator an instruction to confirm the position and state of the cassette based on coping information selected and obtained by the information obtaining unit 412 from the DB 431 (steps S62, S63a, and S63).

When the suction rate is higher than the threshold value and the average deviation is lower than the threshold value, there is a probability that the mounting nozzle 452 brings back a chip component after the mounting operation because suction is sufficiently released due to contamination on the tip of the mounting nozzle 452 or contamination on the filter. Thus, the display 451 shows an operator an instruction to confirm the tip of the mounting nozzle 452 and confirm exchange of filters based on selected and obtained coping information (steps S62, S64a, and S64).

As described above, in the operational examples of FIGS. 12 and 13, a prompt operation is realized by reading a suction rate of a cassette and an average deviation of suction from the DB 431 and referring to the suction rate and the average deviation when a mounting trace is present.

The above explanation discussed the embodiment of the present invention. The present invention is not limited to the above embodiment and many variations are acceptable.

For example, the electronic component, on which the presence or absence of a mounting trace is confirmed, is not limited to a small chip component and somewhat large electronic components such as a CSP and QFP are also applicable. Further, instead of surface mounting, a mounting trace may be confirmed on an electronic component which is inserted and mounted into a board.

In the above embodiment, paste solder is applied to the board to mount chip components. Other paste adhesive materials such as a conductive resin may be applied to the board. Moreover, the adhesive material on which a mounting trace is confirmed is not limited to a conductive material. For example, a mounting trace may be confirmed on a nonconductive adhesive material for supporting mounting of the chip component.

In the above embodiment, image processing is used when the presence or absence of a chip component is confirmed. The presence or absence of a chip component may be confirmed by a so-called three-dimensional measurement.

In the above embodiment, as one (or a part) of the operations for confirming suction and holding performed by the mounting nozzle 452 on a chip component, the tip of the mounting nozzle 452 not having a chip component is photographed by the camera 456 to confirm whether or not holding of a chip component is erroneously recognized. Holding of a chip component may be confirmed by another technique. For example, abnormal holding caused by contamination on the filter of the vacuum passage may be detected by detecting a low pressure of the vacuum passage of the mounting nozzle 452 despite the fact that no chip component is sucked. Furthermore, an operation for actually holding a chip component may be performed so that image analysis confirms whether proper holding is performed or not.

In step S63 of FIG. 13, information is selected from the DB 431 based on a suction rate and an average deviation. The selection is acceptable even when only one of a suction rate and an average deviation is used.

A unit for mounting an electronic component onto the board is not limited to the mounting nozzle 452 which holds an electronic component with suction. A mounting unit for performing holding mechanically or using the action of electrostatic force is also applicable.

In the above embodiment, the nozzle is cleaned and display is provided for an operator in response to a signal from the mounting inspection apparatus 13. As automatic maintenance, other kinds of maintenance including exchange of nozzles and correction of operation control are also applicable. As notification to an operator, an instruction about the contents of work may be outputted via voice and a lamp. The contents of work are not limited to those described in the embodiment and may be properly selected from the DB 431 according to an assumed cause. For example, when a missing component error is detected despite the fact that an absent chip component is not erroneously recognized, an instruction may be notified to an operator to confirm whether or not the mounting nozzle 452 has abnormal blow timing.

Additionally, the mounting inspection apparatus 13 of the above embodiment also inspects an applying state of solder before an electronic component is mounted in the multifunctional mounting apparatus 14. This function may be omitted. Namely, the mounting inspection apparatus for confirming the presence or absence of a mounting trace can be placed downstream of the component mounting apparatus in a variety of mounting systems, and the component mounting apparatus and the mounting inspection apparatus play a role of a mounting system.

According to the present invention, confirmation of the presence or absence of a mounting trace permits a prompt operation when an electronic component is not present on an adhesive material.

What is claimed is:

1. A component mounting control method for controlling mounting of an electronic component, comprising:
   providing an electronic component, an adhesive material, and a board;
   applying the adhesive material onto a predetermined position on the board;
   applying the electronic component onto the adhesive material;
   confirming whether or not the electronic component is present on an adhesive material applied onto the predetermined position on a board;
   confirming whether or not a mounting failure trace of an electronic component is present on the adhesive material, when it is confirmed that no electronic component is present in the adhesive material; and
   communicating the confirmed presence or absence of a mounting failure trace to a controller for controlling a mounting operation of a mounting unit for mounting an electronic component on a predetermined position on the board.

2. The component mounting control method according to claim 1, further comprising, when no electronic component is confirmed to be present in the adhesive material, specifying a mounting unit that has performed a mounting operation, and communicating information that has specified the mounting unit to the controller during communicating the confirmed presence or absence of a mounting failure trace to the controller.

3. The component mounting control method according to claim 1, further comprising confirming a holding operation of an electronic component performed by the mounting unit, and selecting information from a group of information previously prepared according to the confirmed holding operation of an electronic component and the confirmed presence or absence of a mounting failure trace.

4. The component mounting control method according to claim 3, further comprising, upon confirming the holding operation of an electronic component by the mounting unit, confirming whether or not the mounting unit is erroneously recognized as holding an electronic component when the mounting unit holds no electronic component.

5. The component mounting control method according to claim 1, further comprising, when it is confirmed that no electronic component is present on the adhesive material, calling a recognition result obtained when an electronic component was held by the mounting unit, and selecting information from a group of information previously prepared according to the recognition result.

6. The component mounting control method according to claim 1, further comprising, when the mounting failure trace is confirmed to be present on the adhesive material, selecting information from a group of information previously prepared according to at least one of a holding rate and an average deviation of a holding position of the electronic component held by the mounting unit.

7. The component mounting control method according to claim 1, further comprising outputting information obtained by selecting information.

8. The component mounting control method according to claim 3, further comprising performing maintenance according to information obtained by selecting information.

9. The component mounting control method according to claim 1, further comprising in confirming the mounting failure trace on the adhesive material, specifying an electrode-exposed area in an area where an electronic component should be present, and confirming the presence or absence of the mounting failure trace using an area size of the electrode-exposed area.

* * * * *